US011244937B2

(12) United States Patent
Su et al.

(10) Patent No.: US 11,244,937 B2
(45) Date of Patent: Feb. 8, 2022

(54) SPLICED DISPLAY WITH LED MODULES DISPOSED ON TRANSPARENT SUBSTRATE

(71) Applicant: Industrial Technology Research Institute, Hsinchu (TW)

(72) Inventors: Wei-Sheng Su, Taipei (TW); Chia-Hsin Chao, Hsinchu County (TW); Mao-Chi Lin, Tainan (TW); Yen-Hsiang Fang, New Taipei (TW); Li-Chun Huang, Hsinchu (TW); Ming-Hsien Wu, Tainan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 16/706,799

(22) Filed: Dec. 8, 2019

(65) Prior Publication Data

US 2020/0111771 A1   Apr. 9, 2020

Related U.S. Application Data

(63) Continuation-in-part of application No. 16/231,404, filed on Dec. 22, 2018.

(30) Foreign Application Priority Data

Oct. 9, 2018 (TW) ................................. 107135661
Oct. 2, 2019 (TW) ................................. 108135742

(51) Int. Cl.
*G09G 3/32* (2016.01)
*G02B 5/08* (2006.01)
(Continued)

(52) U.S. Cl.
CPC ............. *H01L 25/167* (2013.01); *G09G 3/32* (2013.01); *H01L 23/49816* (2013.01);
(Continued)

(58) Field of Classification Search
CPC ... G09F 9/3026; G02B 6/4298; G06F 3/1446; G09G 3/32; G09G 2300/0426; H01L 31/125
See application file for complete search history.

(56) References Cited

U.S. PATENT DOCUMENTS 5,686,790 A * 11/1997 Curtin .................... G02F 1/1333
313/493
5,808,710 A * 9/1998 Pierson ............... G02F 1/13336
349/73
(Continued)

FOREIGN PATENT DOCUMENTS

| CN | 102082142 | 6/2011 |
|----|-----------|--------|
| CN | 103714744 | 4/2014 |

(Continued)

OTHER PUBLICATIONS

"Office Action of Taiwan Counterpart Application", dated Aug. 10, 2020, p. 1-p. 7.
(Continued)

*Primary Examiner* — Chad M Dicke
(74) *Attorney, Agent, or Firm* — JCIPRNET

(57) ABSTRACT

A spliced display including a transparent substrate, a plurality of light emitting diode modules, at least one control element and a signal transmission structure is provided. The transparent substrate has a display surface and a back surface opposite to each other. The light emitting diode modules are disposed on the back surface of the transparent substrate to be spliced with each other. Each of the light emitting diode modules includes a driving backplane and a plurality of micro light emitting diodes, and the micro LEDs are disposed in an array between the driving backplane and the transparent substrate. The control element is disposed on the transparent substrate. The control element is connected to the light emitting diode modules via the signal transmis-
(Continued)

sion structure, and the light emitting diode modules are connected to each other via the signal transmission structure.

19 Claims, 14 Drawing Sheets

(51) Int. Cl.
    *H01L 25/16*     (2006.01)
    *H01L 23/498*     (2006.01)
    *H01L 23/544*     (2006.01)

(52) U.S. Cl.
    CPC .......... *H01L 23/544* (2013.01); *G02B 5/0808* (2013.01); *G09G 2300/026* (2013.01); *H01L 2223/54426* (2013.01)

(56) References Cited

U.S. PATENT DOCUMENTS

| | | | | |
|---|---|---|---|---|
| 6,005,649 | A * | 12/1999 | Krusius | G02F 1/13336 349/20 |
| 10,606,393 | B2 * | 3/2020 | Cheng | H01L 27/1214 |
| 2002/0050958 | A1 * | 5/2002 | Matthies | H01L 25/167 345/55 |
| 2004/0232939 | A1 * | 11/2004 | Toro-Lira | G09G 3/006 324/760.02 |
| 2005/0078104 | A1 * | 4/2005 | Matthies | H01L 27/156 345/204 |
| 2012/0273751 | A1 * | 11/2012 | Chang | H01L 33/20 257/13 |
| 2016/0154170 | A1 * | 6/2016 | Thompson | B60Q 3/225 362/609 |
| 2016/0306042 | A1 * | 10/2016 | Schrank | H01L 31/02164 |
| 2017/0025593 | A1 * | 1/2017 | Bower | H01L 51/56 |
| 2017/0047393 | A1 | 2/2017 | Bower et al. | |
| 2017/0140679 | A1 * | 5/2017 | Tomoda | G09G 3/3208 |
| 2019/0019443 | A1 * | 1/2019 | Shi | G09G 3/20 |
| 2019/0027534 | A1 * | 1/2019 | Rotzoll | H04N 5/642 |
| 2019/0258346 | A1 * | 8/2019 | Cheng | H01L 27/1214 |
| 2019/0384445 | A1 * | 12/2019 | Huang | G06F 3/0416 |
| 2020/0111771 | A1 * | 4/2020 | Su | G06F 3/1446 |

FOREIGN PATENT DOCUMENTS

| | | |
|---|---|---|
| CN | 103969864 | 8/2014 |
| CN | 106133812 | 11/2016 |
| CN | 107195251 | 9/2017 |
| CN | 108597377 | 9/2018 |
| TW | 569268 | 1/2004 |
| TW | 201810755 | 3/2018 |

OTHER PUBLICATIONS

"Office Action of China Counterpart Application", dated Dec. 8, 2021, p. 1-p. 8.

\* cited by examiner

SPLICED DISPLAY WITH LED MODULES DISPOSED ON TRANSPARENT SUBSTRATE

CROSS REFERENCE TO RELATED APPLICATION

This application is a continuation-in-part application of and claims the priority benefit of a prior application Ser. No. 16/231,404, filed on Dec. 22, 2018, now pending, which claims the priority benefit of Taiwan application serial no. 107135661, filed on Oct. 9, 2018. This application also claims the priority benefit of Taiwan application serial no. 108135742, filed on Oct. 2, 2019. The entirety of each of the above-mentioned patent applications is hereby incorporated by reference herein and made a part of specification.

TECHNICAL FIELD

The disclosure relates to a display, and more particularly, to a spliced display.

BACKGROUND

In order to provide a large-sized display surface, a known technique uses a splicing method to integrate a plurality of display units to display a screen together. For example, an existing video wall splicing technique involves stacking a plurality of small displays on each other to form a large video wall. However, the tiling frame between the frames of the displays and the adjacent displays causes visible gaps between the displays, so that the image screen displayed on the video wall is covered with a plurality of visible black lines, thereby affecting display quality. Moreover, the individual displays are spliced using the tiling frame, and the assembly process thereof is complicated and time-consuming. Moreover, with the developing trend of shrinking display pixel pitch, spliced displays are gradually being applied to small and medium-sized displays, such as personal computer display screens. Therefore, the issues of traditional assembly splicing methods need to be solved to provide consumers with high quality and low-cost display products.

SUMMARY

The disclosure provides a spliced display with good display quality and simple assembly procedure.

A spliced display of the disclosure includes a transparent substrate, a plurality of light emitting diode (LED) modules, at least one control element and a signal transmission structure. The transparent substrate has a display surface and a back surface opposite to each other. The LED modules are disposed on the back surface of the transparent substrate to be spliced with each other. Each of the LED modules includes a driving backplane and a plurality of micro LEDs, and the micro LEDs are disposed in an array between the driving backplane and the transparent substrate. The control element is disposed on the transparent substrate. The control element is connected to the LED modules via the signal transmission structure, and the LED modules are connected to each other via the signal transmission structure.

Based on the above, in the spliced display of the disclosure, a plurality of LED modules are disposed on a single transparent substrate, so that the LED modules may be spliced with each other without being assembled with each other using any tiling frame. Accordingly, there is no visible gap between adjacent LED modules from a tiling frame, and therefore the presence of visible black lines in the image displayed by the spliced display may be avoided to improve display quality. Moreover, since it is only necessary to bond the LED modules to the transparent substrate to complete splicing and the LED modules do not need to be assembled with each other using the tiling frame as in the prior art, the assembly process may be simplified.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
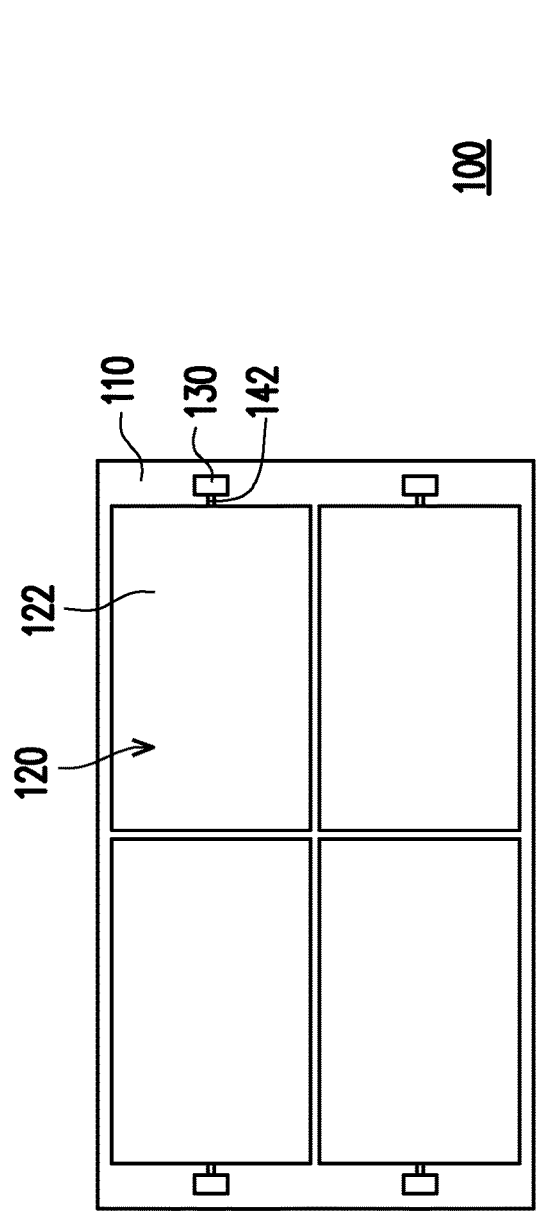
FIG. 1 is a rear view of a spliced display of an embodiment of the disclosure.
Figure 2:
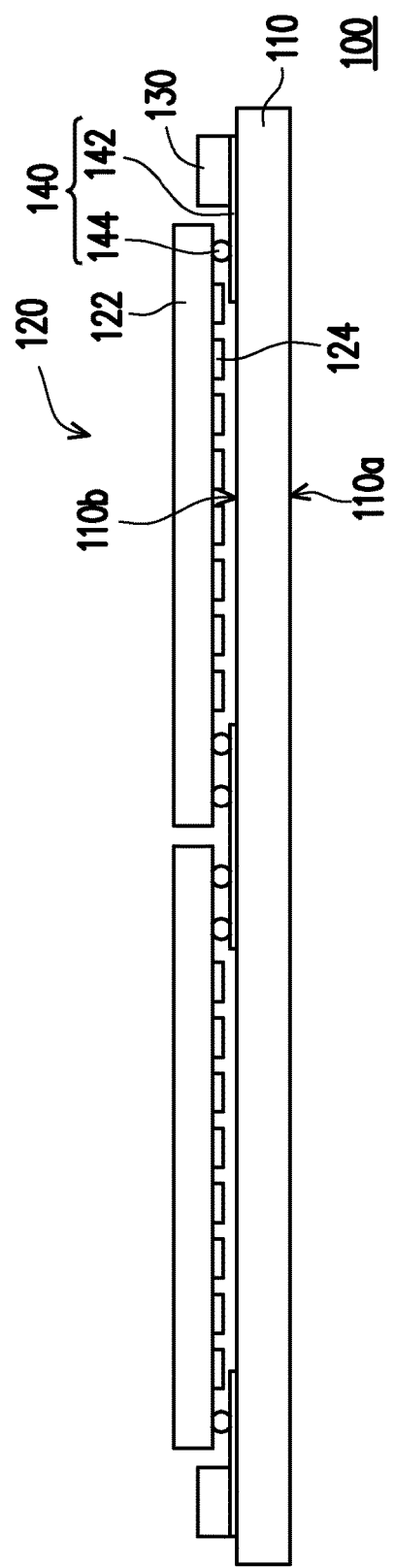
FIG. 2 is a schematic cross-sectional view of the spliced display of FIG. 1.

FIG. 1 is a rear view of a spliced display of an embodiment of the disclosure. FIG. 2 is a schematic cross-sectional view of the spliced display of FIG. 1. Referring to FIG. 1 and FIG. 2, a spliced display 100 of the embodiment includes a transparent substrate 110, a plurality of light-emitting diode (LED) modules 120, at least one control element 130, and a signal transmission structure 140. The transparent substrate 110 is, for example, a transparent glass substrate or a transparent plastic substrate and has a display surface 110a and a back surface 110b opposite to each other. The LED modules 120 are disposed on the back surface 110b of the transparent substrate 110 to be spliced with each other. In FIG. 1, the number of the LED modules 120 is four, but the disclosure is not limited thereto, and the number of the LED modules 120 may actually be more or less.

Each of the LED modules 120 includes a driving backplane 122 and a plurality of micro LEDs 124, and the micro LEDs 124 are arranged in an array on the driving backplane 122 and face the back surface 110b of the transparent substrate 110. That is, the micro LEDs 124 are located between the driving backplane 122 and the transparent substrate 110, and the light emitted by the micro LEDs 124 is incident on the back surface 110b of the transparent substrate 110 and then exits the display surface 110a of the transparent substrate 110 to provide a display screen. The control element 130 includes, for example, a control circuit. In an embodiment of the invention, the control element 130 is disposed on an edge of the back surface 110b of the transparent substrate 110 and is connected to the LED modules 120 via the signal transmission structure 140, and the LED modules 120 are connected to each other via the signal transmission structure 140. The control element 130 is adapted to actively drive the micro LEDs 124 to illuminate to display an image screen on the display surface 110a of the transparent substrate 110.

A plurality of LED modules 120 are disposed on a single transparent substrate 110 as described above, so that the LED modules 120 may be spliced with each other without being assembled with each other using any tiling frame. Accordingly, there is no visible gap between adjacent LED modules 120 from the tiling frame, and therefore the presence of visible black lines in the image displayed by the spliced display 100 may be avoided to improve display quality. Moreover, since it is only necessary to bond the LED modules 120 to the transparent substrate 110 to complete splicing and the LED modules do not need to be assembled with each other using the tiling frame as in the prior art, the assembly process may be simplified.

In the present embodiment, each of the LED modules 120 is bonded to the transparent substrate 110 by, for example, being absorbed by an automated absorption device and moved to a predetermined position of the back surface 110b of the transparent substrate 110, and the back surface 110b of the transparent substrate 110 may have an alignment pattern, a positioning groove (such as a positioning groove 110c to be described later), or other forms of alignment features for the alignment of each of the LED modules 120 to accurately bond each of the LED modules 120 to the predetermined position on the transparent substrate 110. In other embodiments, each of the LED modules 120 may be bonded to the transparent substrate 110 by other suitable means, and the disclosure is not limited in this regard.

In FIG. 1, the number of the control element 130 is four to respectively correspond to the LED modules 120. However, the disclosure is not limited thereto, and the number of the control element 130 may actually be different from the number of the LED modules 120. For example, the number of the control element 130 may be less than the number of the LED modules 120, and one control element 130 is used to drive the plurality of LED modules 120.

The signal transmission structure 140 of the embodiment is specifically described below. Referring to FIG. 2, the signal transmission structure 140 of the embodiment includes a circuit layer 142 and a plurality of conductive bumps 144. The conductive bumps 144 are respectively disposed on the driving backplane 122 and located between the driving backplanes 122 and the back surface 110b of the transparent substrate 110. The circuit layer 142 is disposed on the back surface 110b of the transparent substrate 110 and electrically connected to the control element 130 and the conductive bumps 144. Therefore, the control element 130 may transmit a power signal and a driving signal to each of the LED modules 120 via the circuit layer 142 and the conductive bumps 144.

In the present embodiment, the spliced display 100 may further include an adhesive layer for covering the micro LEDs 124 and filled in the gaps between the LED modules 120. The adhesive layer is, for example, first coated on the driving backplane 122 of each of the LED modules 120, and then extruded as each of the LED modules 120 and the transparent substrate 110 are bonded, so as to be evenly distributed between the LED modules 120 and the transparent substrate 110 and be partially moved toward the gaps between the LED modules 120. The adhesive layer is, for example, an anisotropic conductive paste (ACP) or other types of conductive paste, such that the conductive bumps 144 are electrically connected to the circuit layer 142 via the adhesive layer. In particular, the anisotropic conductive paste may have conductive particles of a suitable particle size for conducting the conductive bumps 144 and the circuit layer 142 and preventing the micro LEDs 124 and the transparent substrate 110 from being unintentionally turned on and causing a short circuit. Moreover, the LEDs 124 may have an insulating layer on the surface thereof to prevent the occurrence of the short circuit. However, the disclosure is not limited thereto, and the conductive bumps 144 may also be directly in contact with the circuit layer 142. Moreover, the adhesive layer is, for example, a semi-transparent black-dyed adhesive material, so that the display screen has good contrast.

Figure 3:
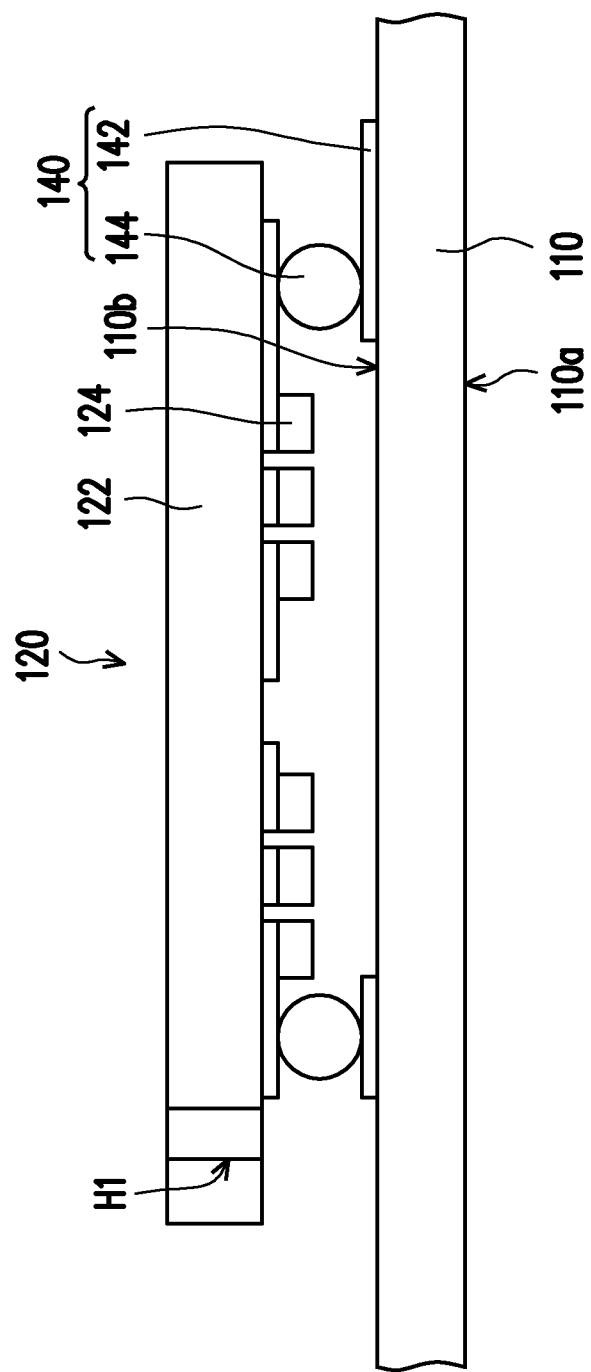
FIG. 3 is a schematic partial cross-sectional view of a spliced display of another embodiment of the disclosure.

FIG. 3 is a schematic partial cross-sectional view of a spliced display of another embodiment of the disclosure. The difference between the embodiment shown in FIG. 3 and the embodiment shown in FIG. 2 is that the driving backplane 122 of FIG. 3 has at least one through-hole H1 for overflowed adhesive. During the process that the adhesive layer is extruded as the LED modules 120 are bonded to the transparent substrate 110, the excess portion of the adhesive layer may be discharged through the through-hole H1 for overflowed adhesive.

Figure 4:
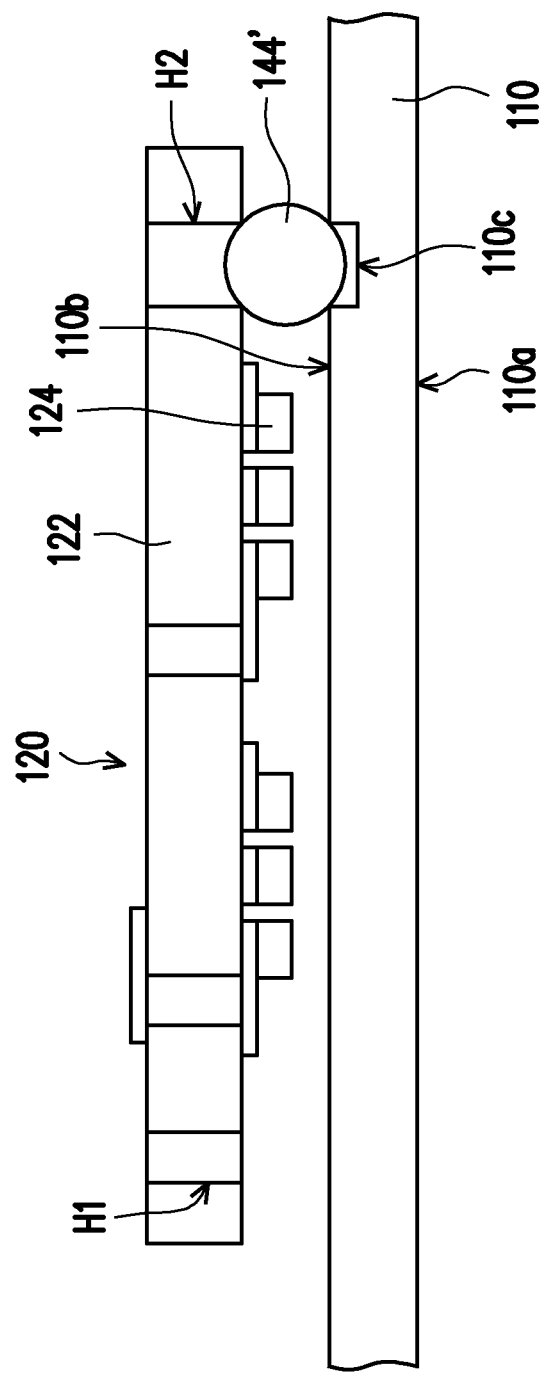
FIG. 4 is a schematic partial cross-sectional view of a spliced display of another embodiment of the disclosure.

FIG. 4 is a schematic partial cross-sectional view of a spliced display of another embodiment of the disclosure. The difference between the embodiment shown in FIG. 4 and the embodiment shown in FIG. 3 is that the LED modules 120 of FIG. 4 include at least one positioning bump 144', the driving backplane 122 further has at least one positioning through-hole H2, and the positioning bump 144' is positioned at an end of the positioning through-hole H2. Moreover, the back surface 110b of the transparent substrate 110 may have a positioning groove 110c as shown in FIG. 4, and the positioning bump 144' is also positioned at the positioning groove 110c. Therefore, the LED modules 120 may be accurately bonded to the transparent substrate 110.

Figure 5:
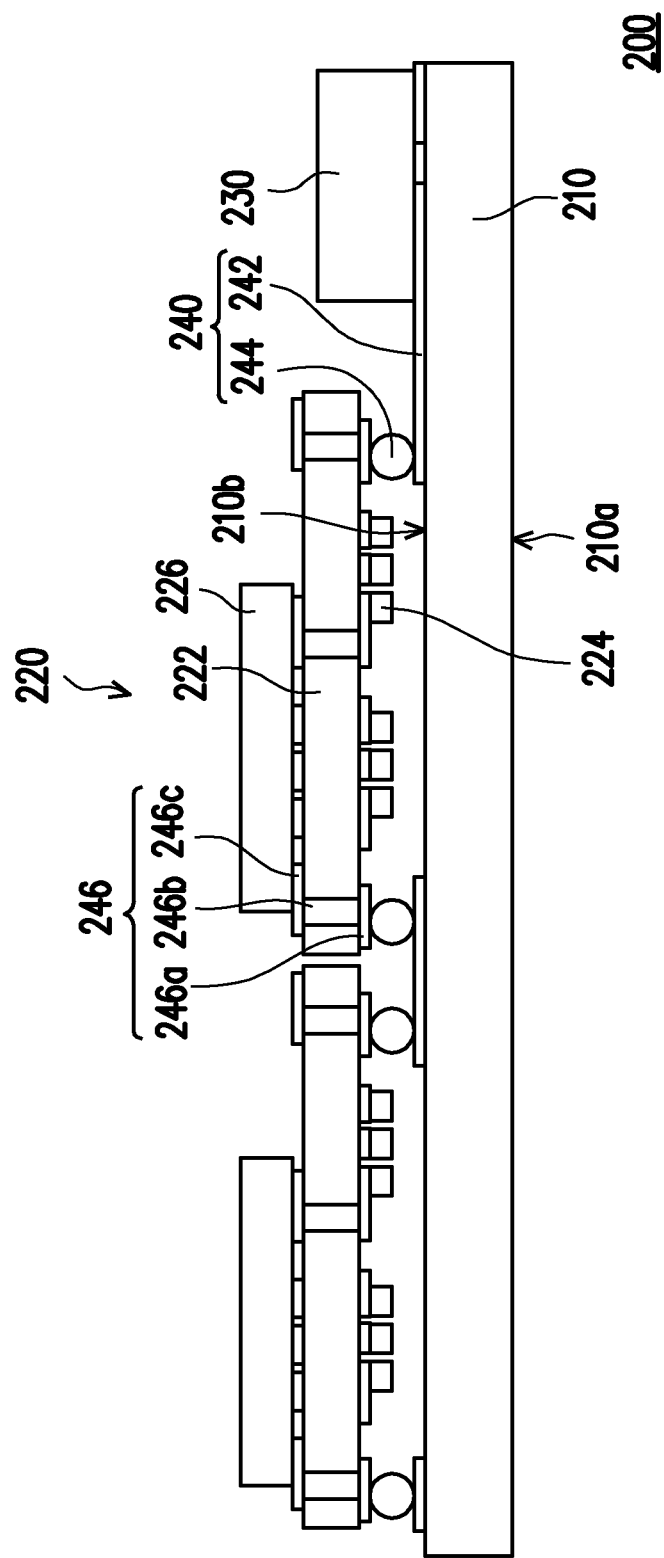
FIG. 5 is a schematic cross-sectional view of a spliced display of another embodiment of the disclosure.

FIG. 5 is a schematic cross-sectional view of a spliced display of another embodiment of the disclosure. In a spliced display 200 of FIG. 5, the configurations and operations of a transparent substrate 210, a display surface 210a, a back surface 210b, LED modules 220, driving backplanes 222, micro LEDs 224, a control element 230, a signal transmission structure 240, a circuit layer 242, and conductive bumps 244 are similar to the configurations and operations of the transparent substrate 110, the display surface 110a, the back surface 110b, the LED modules 120, the driving backplanes 122, the micro LEDs 124, the control elements 130, the signal transmission structure 140, the circuit layer 142, and the conductive bumps 144 of FIG. 2 and are not repeated herein.

The difference between the spliced display 200 and the spliced display 100 is that each of the LED modules 220 further includes at least one driving element 226, and each driving element 226 includes, for example, a driving circuit and is disposed on the driving backplane 222, and the control element 230 is adapted to control the driving element 226 to drive the micro LEDs 224. Therefore, the signal transmission structure 240 of the embodiment further includes a plurality of circuit structures 246 respectively corresponding to the LED modules 220. The circuit structures 246 are respectively disposed on the driving backplanes 222, and each of the circuit structures 246 is connected to the corresponding driving element 226 and the corresponding micro LEDs 224. Thus, the driving element 226 may transmit a drive signal to the micro LEDs 224 through the circuit structures 246.

Specifically, the circuit structures 246 include, for example, a first circuit layer 246a, a conductive through-hole 246b and a second circuit layer 246c. The first circuit layer 246a and the second circuit layer 246c are respectively disposed on two opposite surfaces of each driving backplane 222 and are respectively connected to the conductive bumps 244 and the driving element 226, and the conductive through-hole 246b passes through the driving backplane 222 and is connected between the first circuit layer 246a and the second circuit layer 246c. In other embodiments, the circuit structures 246 may have other suitable configurations, and the disclosure is not limited in this regard.

Figure 6:
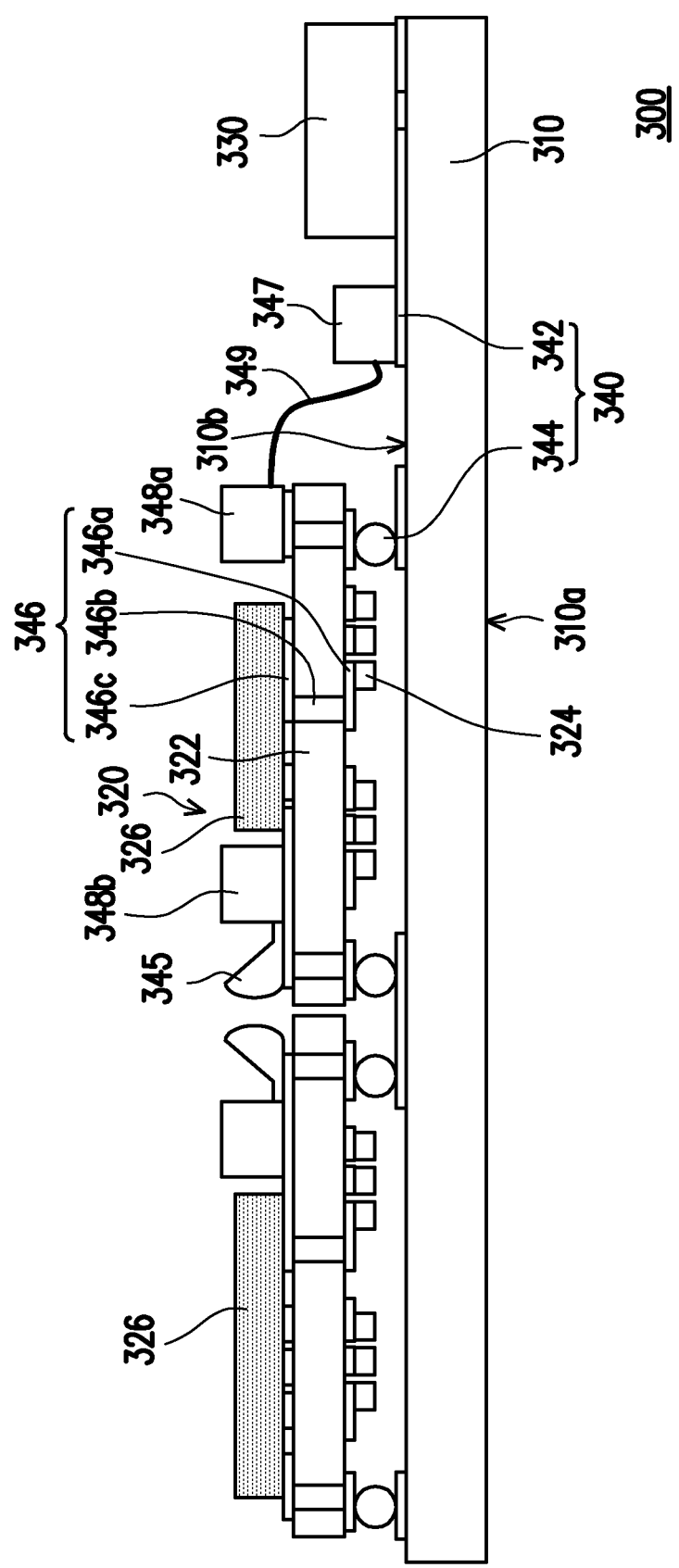
FIG. 6 is a schematic cross-sectional view of a spliced display of another embodiment of the disclosure.
Figure 7:
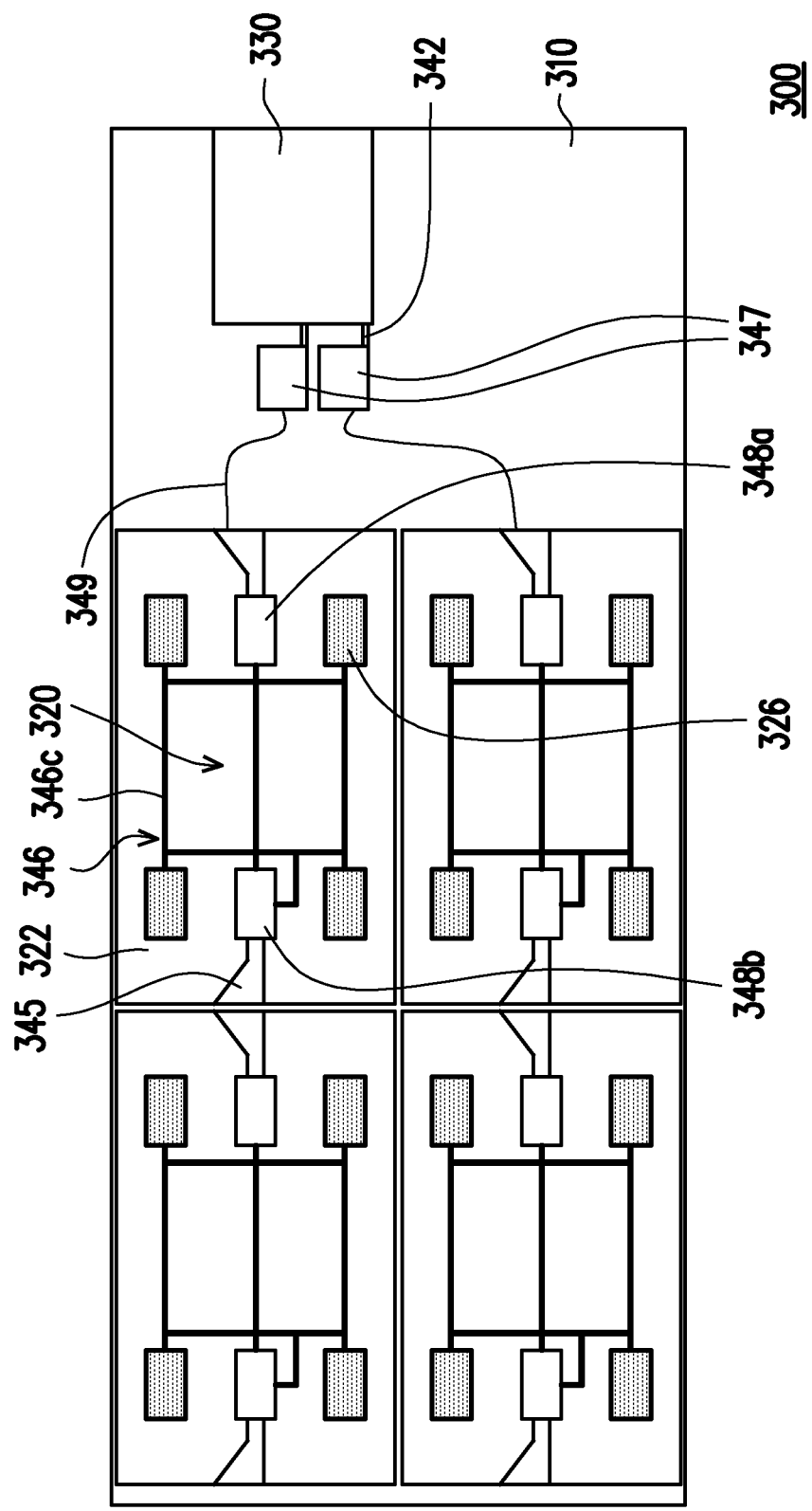
FIG. 7 is a rear view of the spliced display of FIG. 6.

FIG. 6 is a schematic cross-sectional view of a spliced display of another embodiment of the disclosure. FIG. 7 is a rear view of the spliced display of FIG. 6. In a spliced display 300 of FIG. 6 and FIG. 7, the configurations and operations of a transparent substrate 310, a display surface 310a, a back surface 310b, LED modules 320, driving backplanes 322, micro LEDs 324, driving elements 326, a control element 330, a signal transmission structure 340, a circuit layer 342, conductive bumps 344, circuit structures 346, a first circuit layer 346a, a conductive through-hole 346b and a second circuit layer 346c are similar to the configurations and operations of the transparent substrate 210, the display surface 210a, the back surface 210b, the LED modules 220, the driving backplanes 222, the micro LEDs 224, the driving element 226, the control element 230, the signal transmission structure 240, the circuit layer 242, the conductive bumps 244, the circuit structures 246, the first circuit layer 246a, the conductive through-hole 246b and the second circuit layer 246c in the spliced display 200 of FIG. 5 and are not repeated herein.

The difference between the spliced display 300 and the spliced display 200 is that the signal transmission structure 340 further includes at least one first photoelectric conversion element 347 (shown as two), a plurality of second photoelectric conversion elements 348a and 348b, and a plurality of optical waveguides 349. The first photoelectric conversion element 347 is disposed on the back surface 310b of the transparent substrate 310 and is connected to the control element 330. The second photoelectric conversion elements 348a and 348b are respectively disposed on the driving backplane 322, the second photoelectric conversion elements 348a and 348b on the same driving backplane 322 are connected to each other, and the second photoelectric conversion element 348a on the driving backplanes 322 adjacent to the first photoelectric conversion element 347 is connected to the first photoelectric conversion element 347 via the optical waveguides 349. The first photoelectric conversion element 347 converts a control signal from the control element 330 from an electrical signal into an optical signal and transmits it to the second photoelectric conversion element 348a on the adjacent driving backplane 322 via the optical waveguides 349. The second photoelectric conversion element 348a is used, for example, to convert an optical signal into an electrical signal, the second photoelectric conversion element 348b is used, for example, to convert an electrical signal into an optical signal, and the second circuit layer 346c is used for the electrical signal connection between the driving element 326 and the second photoelectric conversion elements 348a and 348b, so that the driving element 326 drives the corresponding micro LED 324. Since in the embodiment, the control signal from the control element 330 is transmitted to the LED modules 320 using the first photoelectric conversion element 347, the electrical transmission path formed by the circuit layer 342 and the conductive bumps 344 may be used only to provide power to the LED modules 320.

More specifically, the signal transmission structure 340 further includes a plurality of optical coupling elements 345, and the optical coupling elements 345 are, for example, optical couplers or other suitable forms of light-transmitting elements respectively disposed on the driving backplanes 322 and respectively directly connected to the corresponding second photoelectric conversion element 348b. At least one of the optical coupling elements 345 on each of the driving backplanes 322 is aligned with at least one of the optical coupling elements 345 on another adjacent driving backplane 322 to enable the optical signal to be transmitted between two optical coupling elements 345 aligned with each other on two adjacent driving backplanes 322. Therefore, the optical signal from the first photoelectric conversion element 347 may be transmitted to the LED modules 320 (i.e., the two LED modules 320 on the left in FIG. 7) away from the first photoelectric conversion element 347 via the optical coupling elements 345.

It should be noted that the number and position of the driving element 326 of each of the LED modules 320 shown in FIG. 6 are only illustrative, and the actual number and position thereof may be four as shown in FIG. 7, and the driving elements 326 are not located in the center of the driving backplanes 322. Moreover, the connection between the first photoelectric conversion element 347 and the second photoelectric conversion element 348a shown in FIG. 6 is only illustrative, and the second photoelectric conversion element 348a is actually disposed with the optical coupling elements 345 as shown in FIG. 7 to make all of the elements on the driving backplanes 322 more symmetrical in order to facilitate mass production. However, the disclosure is not limited thereto. In other embodiments, the second photoelectric conversion element 348a may also be disposed without the optical coupling elements 345.

Figure 8:
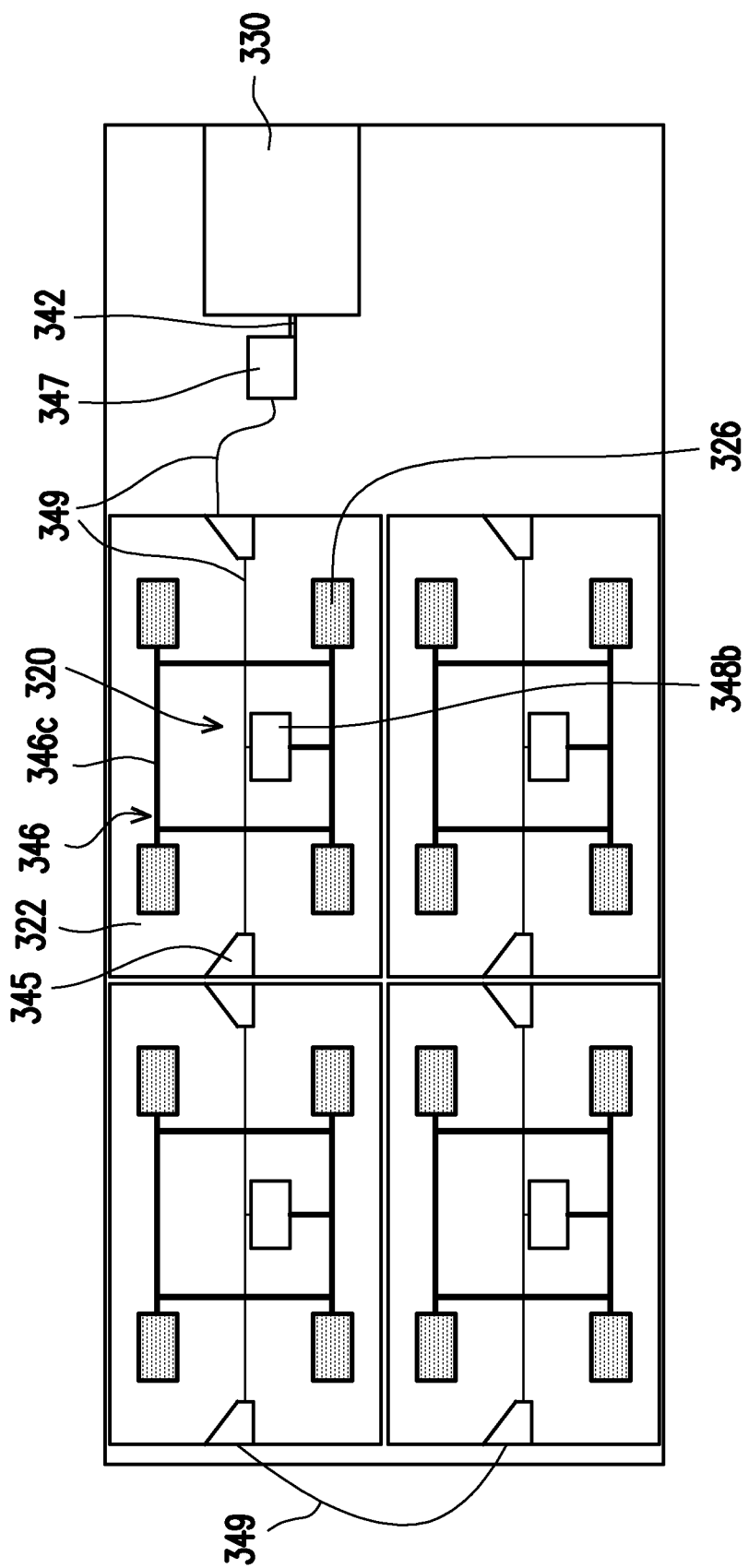
FIG. 8 is a rear view of a spliced display of another embodiment of the disclosure.

FIG. 8 is a rear view of a spliced display of another embodiment of the disclosure. The difference between the embodiment shown in FIG. 8 and the embodiment shown in FIG. 7 is that only one second photoelectric conversion element 348b is disposed on each of the driving backplanes 322 of FIG. 8, and each of the optical coupling elements 345 is connected to the corresponding second photoelectric conversion element 348b via the corresponding optical waveguide 349. Moreover, the number of the first photoelectric conversion element 347 of FIG. 8 is one, and two of the optical coupling elements 345 of two of the LED modules 320 (i.e., the two LED modules 320 on the left in FIG. 8) away from the first photoelectric conversion element 347 are connected to each other via the optical waveguides 349, so that the optical signal from the first photoelectric conversion element 347 may be sequentially transmitted to each of the LED modules 320.

Figure 9:
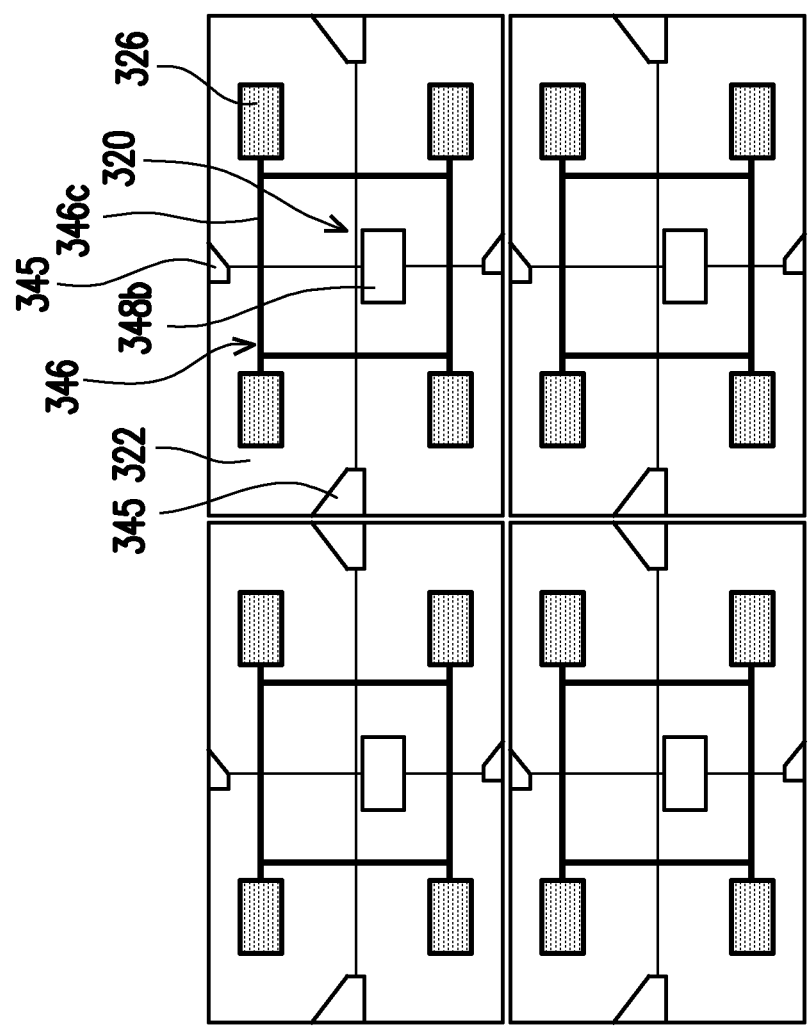
FIG. 9 is a rear view of some of the components of a spliced display of another embodiment of the disclosure.

FIG. 9 is a rear view of some of the components of a spliced display of another embodiment of the disclosure. The difference between the embodiment shown in FIG. 9 and the embodiment shown in FIG. 8 is that in addition to disposing the optical coupling elements 345 at the left and right ends of each of the driving backplanes 322 of FIG. 9, the optical coupling elements 345 are further disposed at the upper and lower ends thereof. As a result, each of the LED modules 320 may perform optical signal transmission directly with all of the LED modules 320 adjacent thereto.

Figure 10:
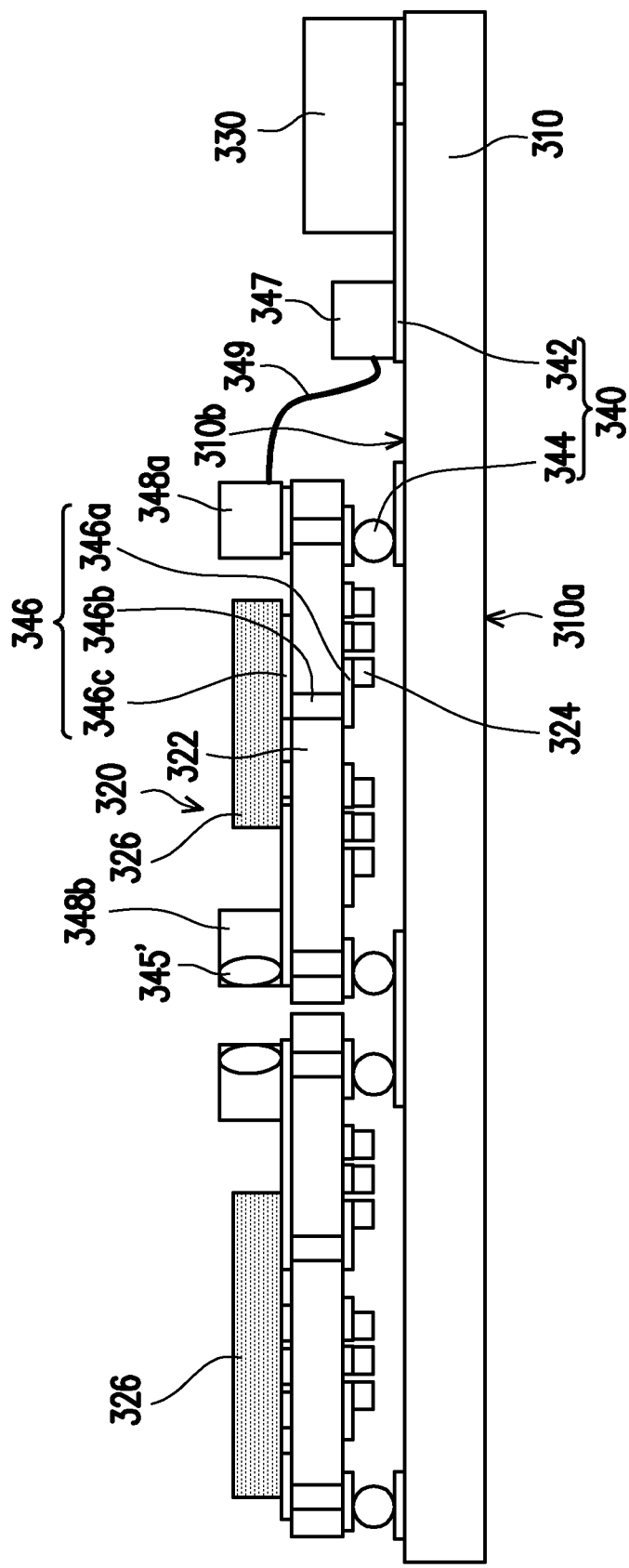
FIG. 10 is a schematic cross-sectional view of a spliced display of another embodiment of the disclosure.

FIG. 10 is a schematic cross-sectional view of a spliced display of another embodiment of the disclosure. The difference between the embodiment shown in FIG. 10 and the embodiment shown in FIG. 6 is that optical coupling elements 345' of FIG. 10 are coupling lenses, and the coupling lenses are integrated in the second photoelectric conversion element 348b. In other embodiments, the optical coupling elements may be in other suitable forms, and the disclosure is not limited in this regard.

Figure 11:
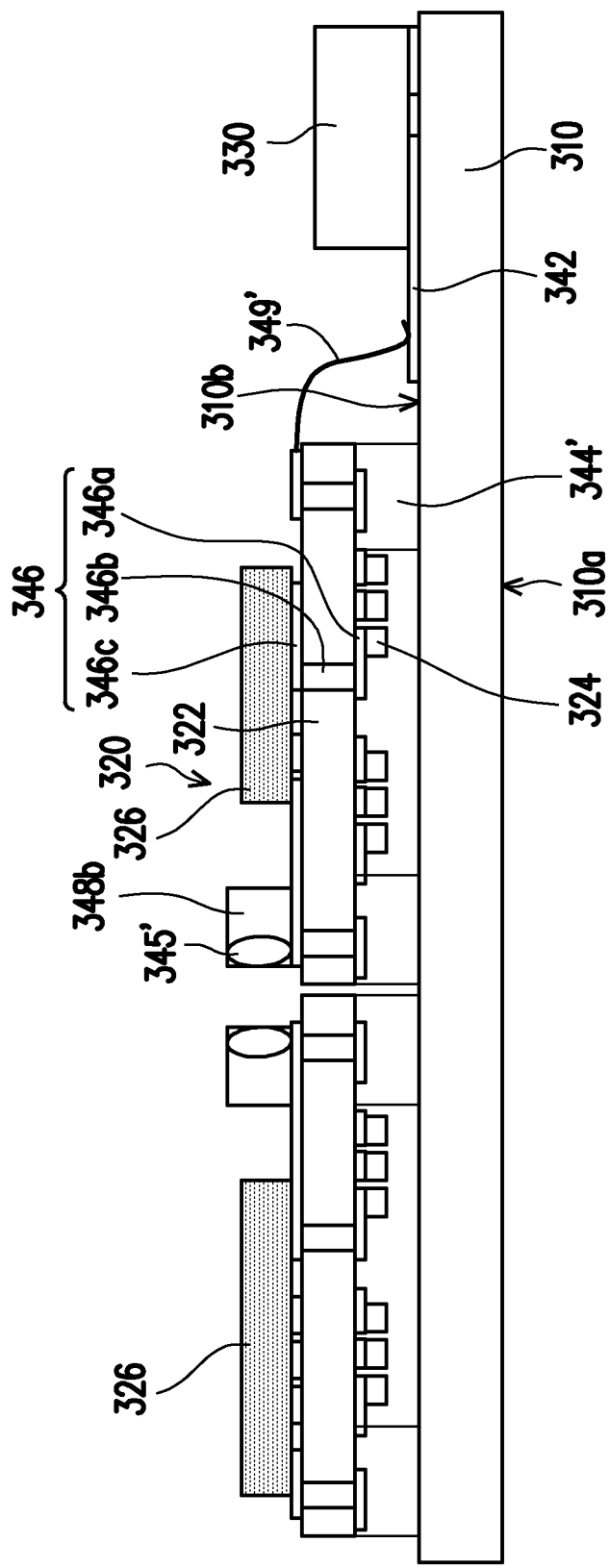
FIG. 11 is a schematic cross-sectional view of a spliced display of another embodiment of the disclosure.

FIG. 11 is a schematic cross-sectional view of a spliced display of another embodiment of the disclosure. The difference between the embodiment shown in FIG. 11 and the embodiment shown in FIG. 10 is that the LED modules 320 of FIG. 11 do not have the conductive bumps 344 shown in FIG. 10, and instead, spacers 344' connected between the driving backplanes 322 and the back surface 310a of the transparent substrate 310 are provided. The spacers 344' provide structural support between the driving backplanes 322 and the transparent substrate 310 without the function of transmitting power signals and control signals. Power signals and control signals are transmitted between the control element 330 and the adjacent LED modules 320 thereof via, for example, a flexible printed circuit (FPC) 349' or other suitable forms of electrical transmission element.

In each of the above embodiments, the adjacent LED modules have gaps at junctions thereof, and in order to prevent the gaps from causing the display screen to be visually discontinuous at the junctions of the LED modules, the pixels located at the junctions of the LED modules may be designed to have a small width, so that the pixel pitch of all pixels is the same. This is specifically described below with reference to the embodiments shown in FIG. 1 and FIG. 2.

Figure 12:
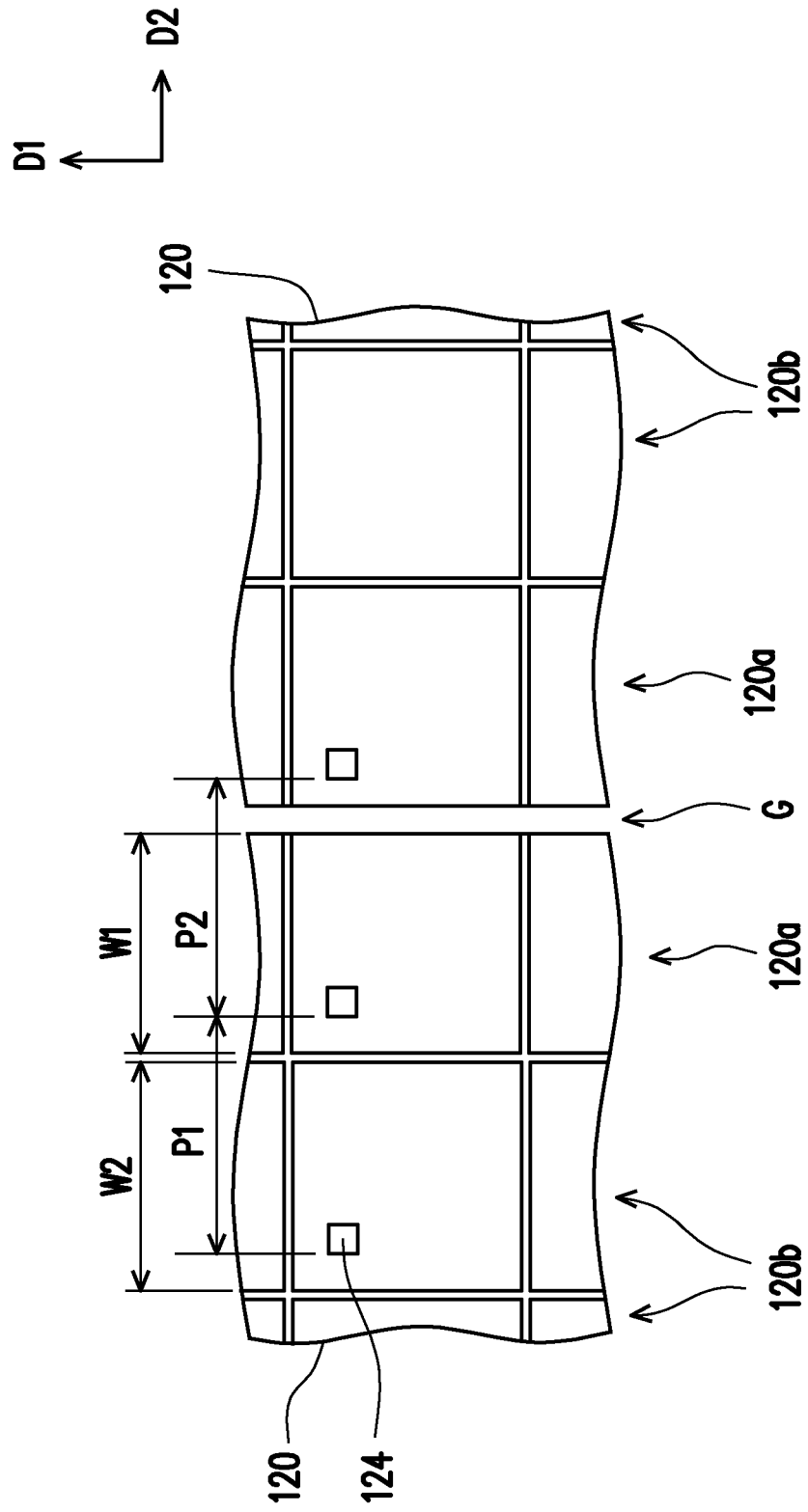
FIG. 12 is a partial enlarged view of junctions of the light emitting diode (LED) modules of FIG. 1.

FIG. 12 is a partial enlarged view of junctions of the light emitting diode (LED) modules of FIG. 1. Referring to FIG. 12, each of the LED modules 120 has a plurality of pixels arranged in an array, the pixels include a plurality of first pixels 120a and a plurality of second pixels 120b, and each of the pixels includes a portion of the micro LEDs 124. To make the drawing clearer, FIG. 12 shows only a few micro LEDs 124. The first pixels 120a of each of the LED modules 120 are arranged along a first direction D1 and adjacent to another LED module 120, and the first pixels 120a of each of the LED modules 120 are located between the second pixels 120b and another LED module 120. That is, the first pixels 120a are pixels located at the outermost periphery of the LED modules 120, and the second pixels 120b are the other pixels not located at the outermost periphery of the LED modules 120. Therefore, a width W1 of each of the first pixels 120a along a second direction D2 perpendicular to the first direction D1 may be designed to be smaller than a width W2 of each of the second pixels 120b along the second direction D2. Therefore, even if there is a gap G between two adjacent LED modules 120, a pixel pitch P2 of two adjacent pixels respectively located at the edge of the two LED modules 120 may be maintained as the pixel pitch P1 between two adjacent pixels of the same LED module 120 to avoid visual discontinuity of the display screen at the junctions of the LED modules. For example, if the width W2 of each of the second pixels 120b is 200 micrometers, the width W1 of each of the first pixels 120a may be reduced to 196 micrometers, but the disclosure is not limited in this regard.

Figure 13A:
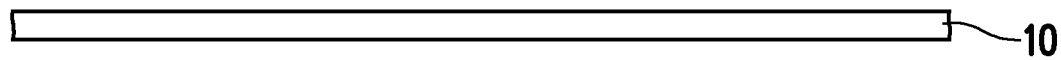
FIG. 13A to FIG. 13F are schematic views of a manufacturing process of a driving backplane of an embodiment of the disclosure.
Figure 13B:
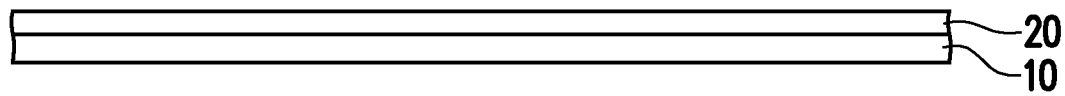
Figure 13C:
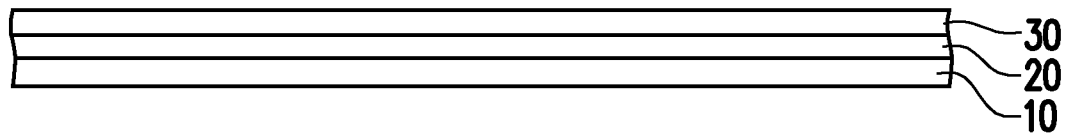
Figure 13D:
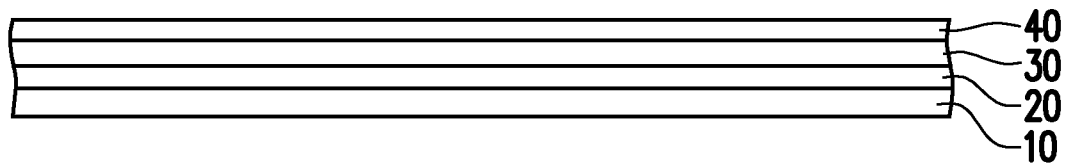
Figure 13E:
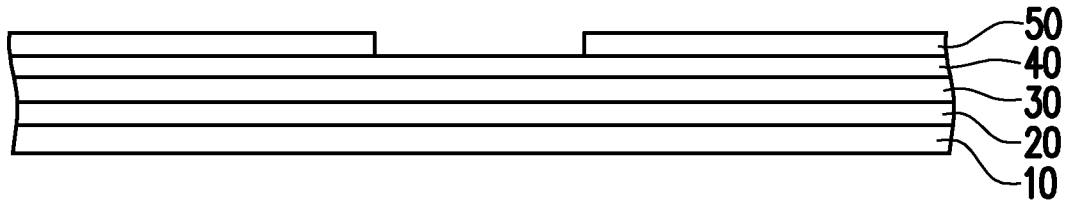
Figure 13F:
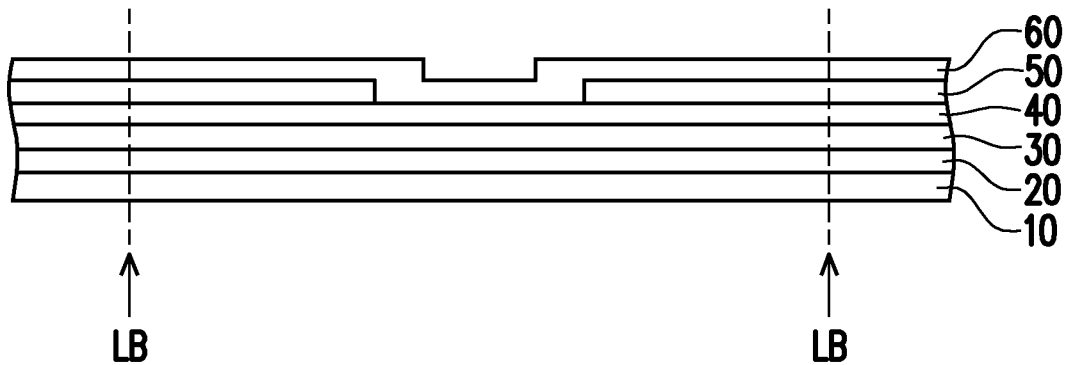
Figure 14:
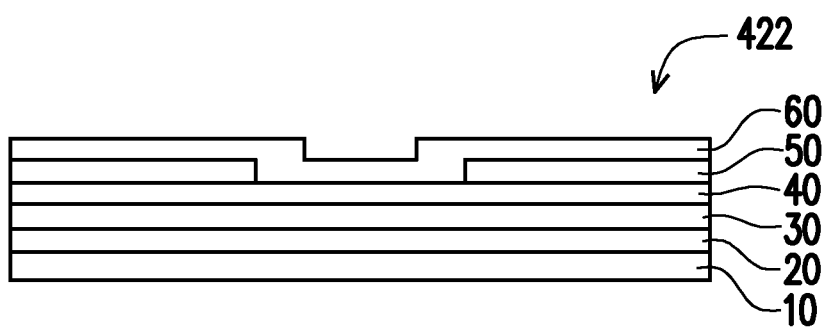
FIG. 14 illustrates a driving backplane manufactured by the manufacturing process shown in FIG. 13A to FIG. 13F.

A manufacturing process of the driving backplanes is described according to the accompanying drawings. FIG. 13A to FIG. 13F are schematic views of a manufacturing process of a driving backplane of an embodiment of the disclosure. FIG. 14 illustrates a driving backplane manufactured by the manufacturing process shown in FIG. 13A to FIG. 13F. First, referring to FIG. 13A, a carrier 10 is provided. The carrier 10 is, for example, a glass substrate. Then, referring to FIG. 13B, a reflective layer 20 is formed on the carrier 10. The reflective layer 20 is made of a material such as aluminum, titanium or barium that tends to be easily attached to the glass substrate, has a high reflectivity for lasers and has a thickness of at least 100 Å. Referring to FIG. 13C, a first dielectric layer 30 is formed on the reflective layer 20. Referring to FIG. 13D, a first circuit layer 40 is formed on the first dielectric layer 30. The first circuit layer 40 is, for example, a redistribution layer (RDL). Referring to FIG. 13E, a second dielectric layer 50 is formed on the first circuit layer 40. Referring to FIG. 13F, a second circuit layer 60 is formed on the second dielectric layer 50. The second circuit layer 60 is, for example, a RDL. Then, the structure is cut by a laser LB along a dashed line shown in FIG. 13F to form a plurality of driving backplanes.

FIG. 14 illustrates a single driving backplane 422 (shown as conductive through-holes that are not completely manufactured) which may be used in the LED modules in any one of the embodiments described above. The driving backplane 422 includes the carrier 10 that is cut, the reflective layer 20, the first dielectric layer 30, the first circuit layer 40, the second dielectric layer 50 and the second circuit layer 60. The first and the second circuit layers 40 and 60 and the reflective layer 20 are respectively located at two opposite sides of the first dielectric layer 30. The micro LEDs are, for example, disposed on the second circuit layer 60 of the driving backplane 422. With the disposition of the reflective layer 20, an outer peripheral portion of the laser beam is reflected by the reflective layer 20 during the process of cutting using the laser LB to prevent the first and the second circuit layers 40 and 60 from unintentionally absorbing the laser beam and structurally damaged.

Figure 15:
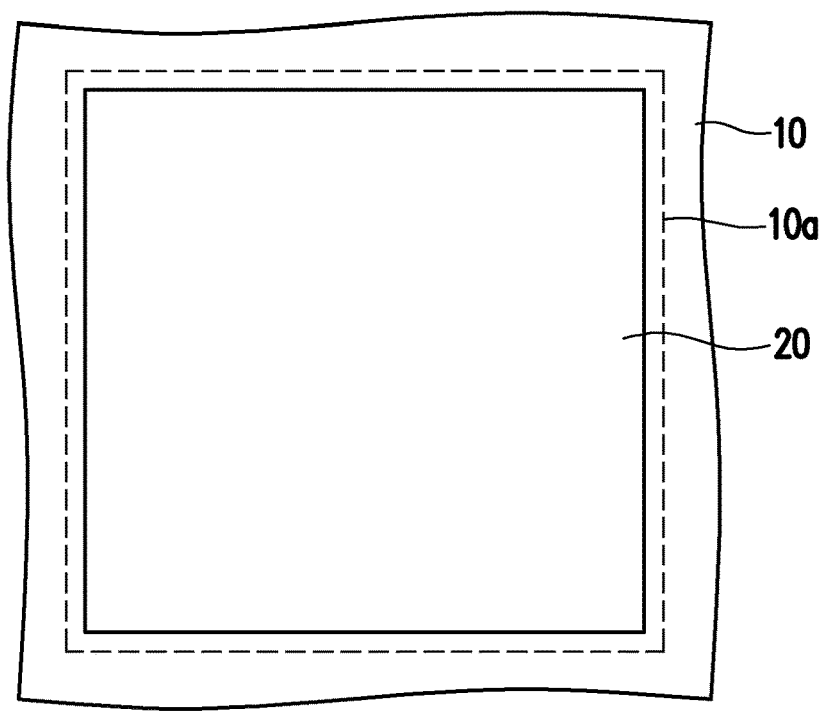
FIG. 15 is a partial top view of the the carrier and the reflective layer of FIG. 13.

The reflective layer 20 of FIG. 13B to FIG. 13F is only illustrative, and actually, they may be patterned without overlapping a cutting line, which is described with reference to the accompanying drawings below. FIG. 15 is a partial top view of the carrier and the reflective layer of FIG. 13F. Since it is not necessary to reflect the laser beam by the reflective layer 20 along a cutting line 10a, the reflective layer 20 actually may be formed as shown in FIG. 15 without covering the cutting line 10a (corresponding to the dashed line shown in FIG. 13F).

Figure 16:
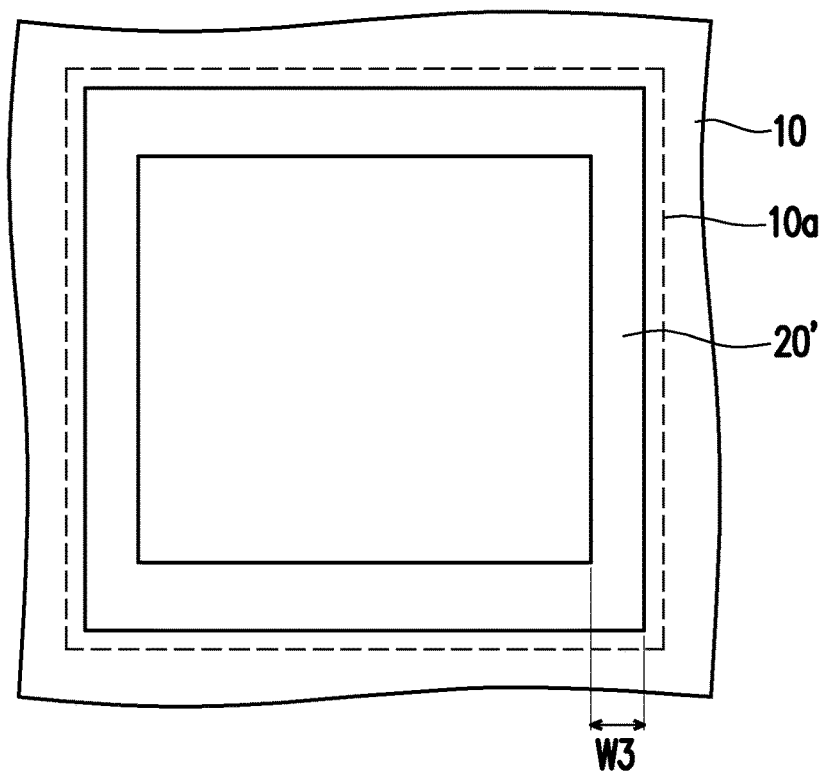
FIG. 16 is a partial top view of a carrier and a reflective layer another embodiment of the disclosure.

FIG. 16 is a partial top view of a carrier and a reflective layer of another embodiment of the disclosure. The difference between the embodiment shown in FIG. 16 and the embodiment shown in FIG. 15 is that a reflective layer 20' is a closed annular shape, and is not like the reflective layer 20 of FIG. 15 which is a complete square shape as a width W3 of this closed annular structure is designed to sufficiently cover the outer peripheral portion of the laser beam.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A spliced display, comprising:
a transparent substrate, having a display surface and a back surface opposite to each other;
a plurality of light emitting diode (LED) modules, disposed on the back surface of the transparent substrate to be spliced with each other, wherein each of the LED modules comprises a driving backplane and a plurality of micro LEDs, and the plurality of micro LEDs are disposed in an array between the driving backplane and the transparent substrate;
at least one control element, disposed on the transparent substrate; and
a signal transmission structure, wherein the at least one control element is connected to the plurality of LED modules via the signal transmission structure, and the plurality of LED modules are connected to each other via the signal transmission structure,
wherein the driving backplane comprises a reflective layer, at least one dielectric layer and at least one circuit layer, and the at least one dielectric layer and the at least one circuit layer are located between the micro LEDs and the reflective layer,
the at least one dielectric layer is located between the at least one circuit layer and the reflective layer, and
the micro LEDs are disposed on the at least one circuit layer and are not in contact with the at least one dielectric layer.

2. The spliced display of claim 1, wherein the at least one control element is disposed on an edge of the back surface of the transparent substrate.

3. The spliced display of claim 1, wherein the signal transmission structure comprises a circuit layer and a plurality of conductive bumps, the plurality of conductive bumps are respectively disposed between the driving backplanes and the transparent substrate, and the circuit layer of the signal transmission structure is disposed on the back surface of the transparent substrate and electrically connected to the at least one control element and the plurality of conductive bumps.

4. The spliced display of claim 3, wherein each of the LED modules comprises at least one positioning bump, each of the driving backplanes has at least one positioning through-hole, and the at least one positioning bump is located at an end of the at least one positioning through-hole.

5. The splicing display apparatus according to claim 1, comprising an adhesive layer, wherein the adhesive layer covers the plurality of micro LEDs and is filled in a gap between the plurality of LED modules.

6. The spliced display of claim 5, wherein each of the driving backplanes has at least one through-hole, and a portion of the adhesive layer is adapted to be discharged via the at least one through-hole.

7. The spliced display of claim 1, wherein the at least one control element is adapted to actively drive the plurality of micro LEDs.

8. The spliced display of claim 1, wherein each of the plurality of LED modules comprises at least one driving element, the at least one driving element is disposed on the driving backplane, and the at least one control element is adapted to control the at least one driving element to drive the plurality of micro LEDs.

9. The spliced display of claim 8, wherein the signal transmission structure comprises a plurality of circuit structures, the plurality of circuit structures are respectively disposed on the driving backplanes, and each of the plurality of circuit structures is connected to the at least one corresponding driving element and the plurality of corresponding micro LEDs.

10. The spliced display of claim 9, wherein the signal transmission structure comprises at least one first photoelectric conversion element, a plurality of second photoelectric conversion elements, and a plurality of optical waveguides, the at least one first photoelectric conversion element is disposed on the transparent substrate and connected to the at least one control element, the plurality of second photoelectric conversion elements are respectively disposed on the driving backplanes, the plurality of second photoelectric conversion elements on the same driving backplane are connected to each other via at least one of the optical waveguides, the second photoelectric conversion element on the driving backplane adjacent to the first photoelectric conversion element is connected to the first photoelectric conversion element via at least one of the optical waveguides, and each of the plurality of second photoelectric conversion elements is connected to at least one corresponding driving element through the corresponding circuit structure.

11. The spliced display of claim 10, wherein the signal transmission structure comprises a plurality of optical coupling elements, the plurality of optical coupling elements are respectively disposed on the driving backplanes and respectively connected to the plurality of corresponding second photoelectric conversion elements, and at least one of the optical coupling elements on each of the driving backplane is aligned with at least one of the optical coupling elements on another adjacent driving backplane.

12. The spliced display of claim 11, wherein each of the plurality of optical coupling elements is directly connected to the corresponding second photoelectric conversion element.

13. The spliced display of claim 11, wherein each of the optical coupling elements is connected to the corresponding second photoelectric conversion element via the corresponding optical waveguide.

14. The spliced display of claim 1, wherein each of the plurality of LED modules comprises at least one spacer, and the at least one spacer is connected between the driving backplane and the back surface of the transparent substrate.

15. The spliced display of claim 1, wherein each of the plurality of LED modules has a plurality of pixels arranged in an array, each of the plurality of pixels comprises a portion of the plurality of micro LEDs, the plurality of pixels comprise a plurality of first pixels and a plurality of second pixels, the plurality of first pixels are adjacent to another one of the plurality of LED modules and located between the plurality of second pixels and the another one of the LED module, and a width of each of the plurality of first pixels is smaller than a width of each of the plurality of second pixels.

16. The spliced display of claim 15, wherein the plurality of first pixels are arranged along a first direction, the plurality of second pixels are arranged along the first direction, and the width of each of the plurality of first pixels along a second direction perpendicular to the first direction is smaller than the width of each of the plurality of second pixels along the second direction.

17. The spliced display of claim 1, wherein a material of the reflective layer comprises aluminum, titanium or barium.

18. The spliced display of claim 1, wherein the at least one circuit layer of the driving backplane and the reflective layer are respectively located at two opposite sides of the at least one dielectric layer.

19. The spliced display of claim 1, wherein the reflective layer is a closed annular shape.

\* \* \* \* \*